(12) United States Patent
Tan

(10) Patent No.: US 7,725,858 B2
(45) Date of Patent: May 25, 2010

(54) PROVIDING A MOAT CAPACITANCE

(75) Inventor: Fern Nee Tan, Penang (MY)

(73) Assignee: Intel Corporation, Santa Clara, CA (US)

( * ) Notice: Subject to any disclaimer, the term of this patent is extended or adjusted under 35 U.S.C. 154(b) by 406 days.

(21) Appl. No.: 11/823,222

(22) Filed: Jun. 27, 2007

(65) Prior Publication Data

US 2009/0001512 A1    Jan. 1, 2009

(51) Int. Cl.
*G06F 17/50* (2006.01)
(52) U.S. Cl. .................. 716/8; 716/4; 257/532
(58) Field of Classification Search ........................ None
See application file for complete search history.

(56) References Cited

U.S. PATENT DOCUMENTS

| | | | | |
|---|---|---|---|---|
| 4,943,536 A * | 7/1990 | Havemann | ............... | 438/207 |
| 5,289,021 A * | 2/1994 | El Gamal | ............... | 257/206 |
| 5,754,826 A * | 5/1998 | Gamal et al. | ............... | 703/14 |
| 5,808,272 A * | 9/1998 | Sun et al. | ............... | 219/121.68 |
| 6,237,126 B1 * | 5/2001 | Bonitz | ............... | 716/4 |
| 6,550,047 B1 * | 4/2003 | Becker | ............... | 716/8 |
| 6,567,717 B2 * | 5/2003 | Krivokapic et al. | ............... | 700/121 |
| 6,586,755 B1 * | 7/2003 | Krivokapic et al. | ............... | 250/492.21 |
| 7,161,218 B2 * | 1/2007 | Bertin et al. | ............... | 257/415 |
| 7,178,126 B2 * | 2/2007 | Arai et al. | ............... | 716/14 |
| 7,202,548 B2 * | 4/2007 | Lee | ............... | 257/532 |
| 7,205,880 B2 * | 4/2007 | Fukunaga | ............... | 338/195 |
| 2005/0169033 A1 * | 8/2005 | Sugita et al. | ............... | 365/63 |
| 2008/0142860 A1 * | 6/2008 | Chen et al. | ............... | 257/296 |

* cited by examiner

*Primary Examiner*—Leigh Marie Garbowski
(74) *Attorney, Agent, or Firm*—Trop, Pruner & Hu, P.C.

(57) ABSTRACT

In one embodiment, the present invention includes an apparatus having core logic formed on a die, input/output (IO) buffers surrounding the core logic, and a moat capacitance surrounding the IO buffers and extending to an edge of the die. Other embodiments are described and claimed.

17 Claims, 4 Drawing Sheets

PROVIDING A MOAT CAPACITANCE

BACKGROUND

Semiconductor devices are typically formed of a plurality of layers deposited on a wafer and include various circuitry to perform desired functions. On a semiconductor die, which is an independent portion of a wafer having a complete design, on-die capacitance is used to suppress high frequency noise that is generated by certain circuitry. For example, many circuits include an input/output (IO) buffer that may generate such noise due to the high-speed switching of the buffer. Typically, on-die capacitance surrounds each IO buffer block to ensure noise compliance. Conventionally, the on-die capacitance which surrounds each IO block cannot be altered as it affects the entire die form factor, and die size shrinkage is near impossible (especially near tape out time of a design), unless the IO buffer has serious performance issues. Therefore, a conventional design usually carries more than required amounts of on-die capacitance. This is an overhead in design cost and a waste of silicon real estate.

DETAILED DESCRIPTION

In various embodiments, a semiconductor device may be designed to include on-die capacitance located substantially around a periphery of virtually all other circuitry of the semiconductor device. In various embodiments, such a capacitance may be referred to as a moat on-die capacitance, as it substantially surrounds the circuitry of the die. While the scope of the present invention is not limited in this regard, various embodiments may be implemented in a chipset component, such as a chipset to be coupled between a processor of a system and various other components such as system memory, IO devices, other peripheral components and so forth. More specifically, in some embodiments a moat on-die capacitance may be designed around the four edges of a die to provide an opportunity for flexibility and easy alteration/shrinkage of the entire die size uniformly.

Figure 1:
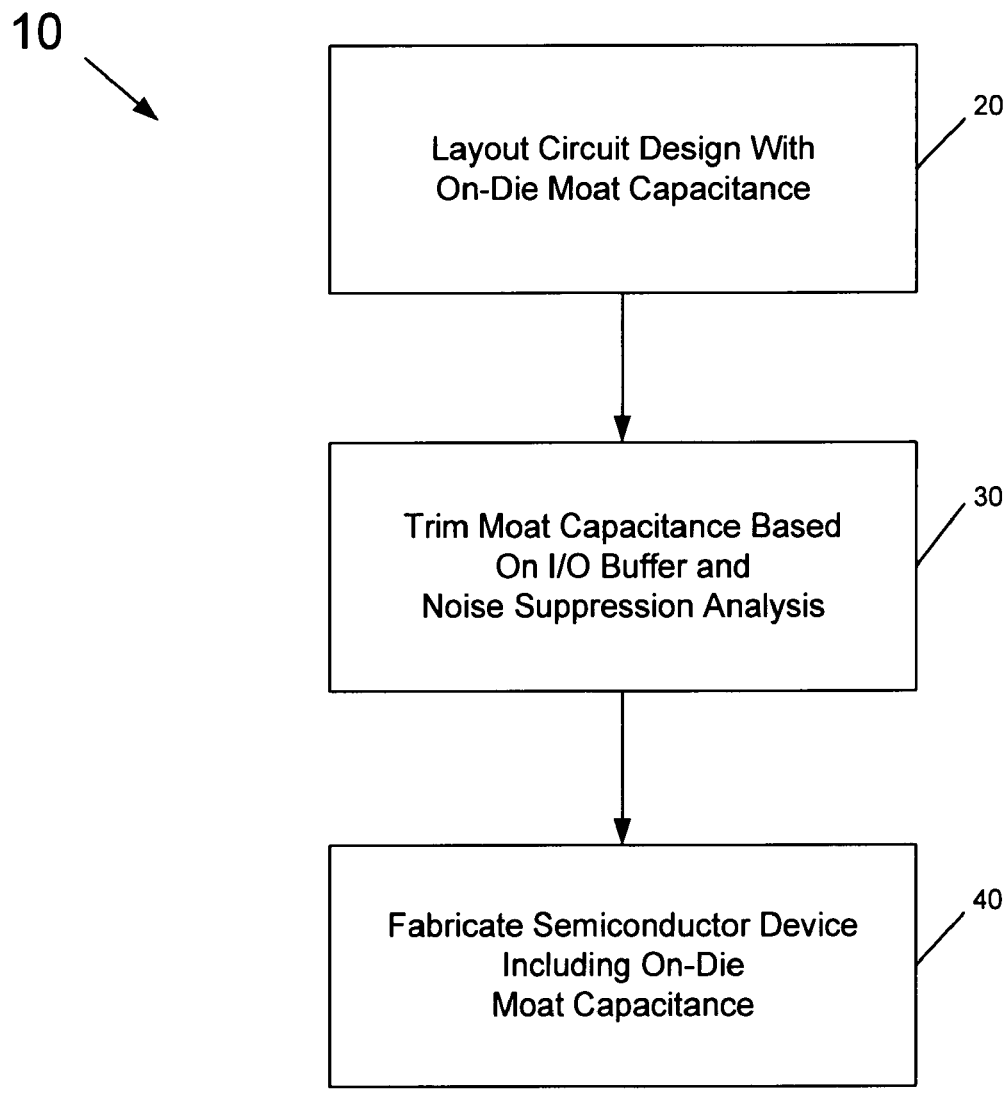
FIG. 1 is a flow diagram of a method in accordance with one embodiment of the present invention.

Referring now to FIG. 1, shown is a flow diagram of a method in accordance with one embodiment of the present invention. As shown in FIG. 1, method 10 may be used to design and fabricate a semiconductor device in accordance with an embodiment of the present invention. As shown in FIG. 1, method 10 may begin by laying out a circuit design with a so-called on-die moat capacitance (block 20). Specifically, a given circuit may be laid out such that all of its active and passive circuitry, with the exception of on-die capacitance may be laid out in an interior portion of a layout design, while the moat capacitance may be designed to substantially surround the remainder of the circuitry, along all edges of the die.

After designing such a circuit, various simulations may be performed to determine parameters for operation of the designed chip. For example, various simulations with regard to performance, timing considerations, noise considerations and so forth may be run. Based on such simulations it may be determined that based on circuit performance, as well as noise and/or power considerations, the moat capacitance may be trimmed (block 30). More specifically, it may be determined that suitable performance can be achieved without the designed amount of moat capacitance. Accordingly, the design may be updated to reduce the amount of on-die capacitance, e.g., by trimming the size of the die in at least one of the edges. Thus the moat capacitance may be updated to be of a substantially sufficient amount to meet a noise margin or specification of a device, yet not exceed this amount or size. Accordingly, there is not more than a required amount of on-die capacitance. In some embodiments all four edges may be trimmed and in other implementations two or three of the edges may be trimmed. Thus in certain embodiments, trimming operations may be realized in two dimensions (i.e., vertical and horizontal).

After the design is completed, the semiconductor device may be fabricated including the on-die moat capacitance (block 40). For example, various well-known semiconductor manufacturing techniques may be performed to deposit and pattern various layers including conductive and non-conductive layers. In various embodiments, the on-die capacitance may be formed of alternating layers of metal and insulation material (i.e., a metal-insulator-metal (MIM) capacitance), although the scope of the present invention is not limited in this regard. For example, in other embodiments, on-die capacitance may be formed of one or more layers of a dielectric material such as a relatively high dielectric constant (high-k) material. In yet other embodiments, an on-die moat capacitance may be formed of scalable thick or thin gate oxides. While shown with this particular implementation in the embodiment of FIG. 1, the scope of the present invention is not limited in this regard.

Figure 2:
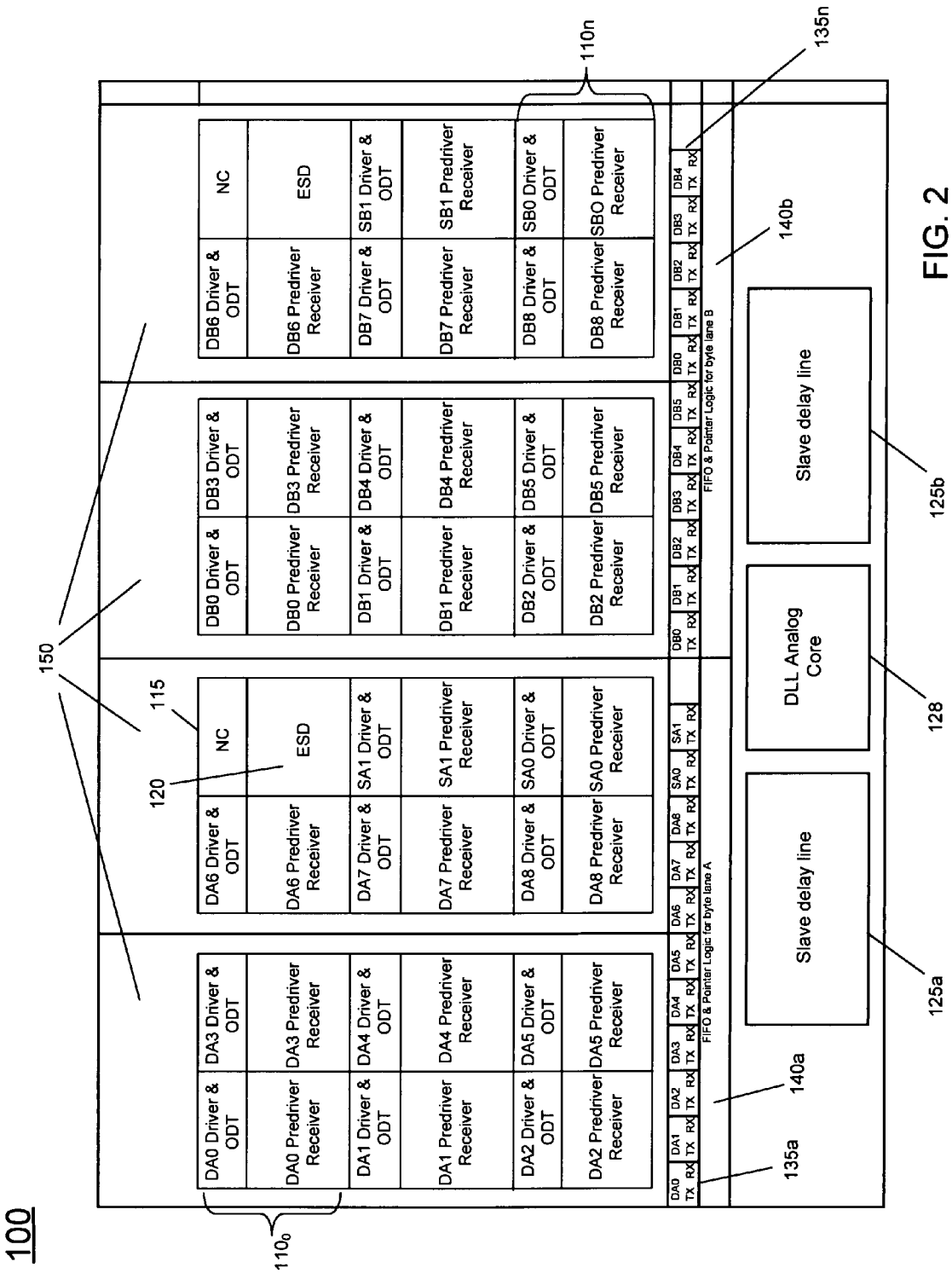
FIG. 2 is a block diagram of a portion of semiconductor device in accordance with an embodiment of the present invention.

Referring now to FIG. 2, shown is a block diagram of a portion of a semiconductor device in accordance with an embodiment of the present invention. As shown in FIG. 2, portion 100 of the semiconductor device, which may be a chipset component, may include a plurality of IO buffers $110_0$-$110_n$ (generically IO buffer 110). As shown in FIG. 2, each IO buffer 110 may include a pre-driver, driver, a receiver, as well as on-die termination (ODT), although the scope of the present invention is not limited in this regard. In addition, the interior portion of portion 100 may include additional cells such as an electrostatic discharge (ESD) block 120, and a non-cell (NC) 115 that includes no design circuitry. Further, additional components to provide communication between IO buffers 110 and other circuitry of the semiconductor device may include transmitters/receivers (TX/RX) $135_a$-$135_n$ (generically TX/RX 135), first in first out (FIFO) buffers and corresponding pointer logic (FIFO $140_a$ and $140_b$). Still further, the semiconductor device may include additional circuitry such as slave delay lines $125_a$ and $125_b$, along with a delay lock loop (DLL) analog core 128. Note that in the embodiment of FIG. 2, this additional circuitry (i.e., all but IO buffer 110) may be part of the core logic of the semiconductor device.

Referring still to FIG. 2, on-die capacitance 150 may be provided substantially around the edges of a die, i.e., to the periphery of IO buffers 110. Note that only this top part of portion 100 corresponds to an edge of the die. By moving the on-die capacitance to the edge of the die, flexibility or shrinkage/trimming may be realized when a particular integrated circuit's (IC) design is determined to be excessive. Still further, such trimming may be easily accomplished without requiring any re-layout or other significant design efforts.

Figure 3:
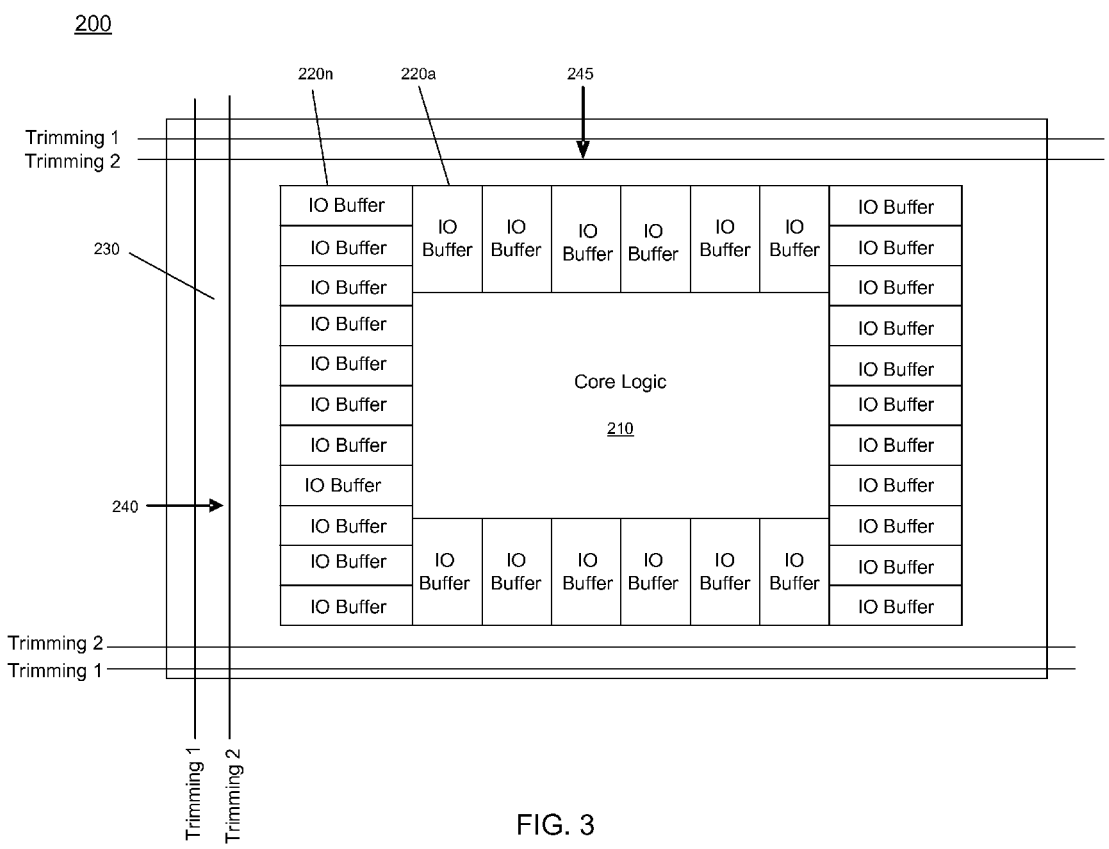
FIG. 3 is a block diagram of a semiconductor device in accordance with another embodiment of the present invention.

Referring now to FIG. 3, shown is a block diagram of a semiconductor device in accordance with another embodiment of the present invention. As shown in FIG. 3, semiconductor device 200 may correspond to a die design, e.g., for a chipset that includes a core logic 210 and a plurality of IO buffers 220$_a$-220$_n$ (generically IO buffers 220) that surrounds core logic 210. Note that portion 100 shown in FIG. 2 may correspond to a part of semiconductor device 200. Core logic 210 may perform various operations on incoming/outgoing data. In turn, IO buffers 220 are surrounded by an on-die moat capacitance 230. As shown in FIG. 3, die size shrinkage may be realized, e.g., as improvements in manufacturing technology nodes occur, or as a result of design changes, simulation results and so forth. Accordingly, die size shrinkage may be realized by trimming on-die moat capacitance 230 in both a first direction 240, as well as a second direction 245. As shown in FIG. 3, the dashed lines may represent a first trimming level and a second trimming level, although various designs may have additional trimming performed as the result of additional simulations performed and so forth.

Accordingly, the amount of on-die capacitance silicon needed to obtain an optimal amount of capacitance for various semiconductor devices may be realized. In this way, a power decoupling solution may be tailored to actual IO buffer performance and noise suppression without re-layout and prolonging design timelines is effected.

Figure 4:
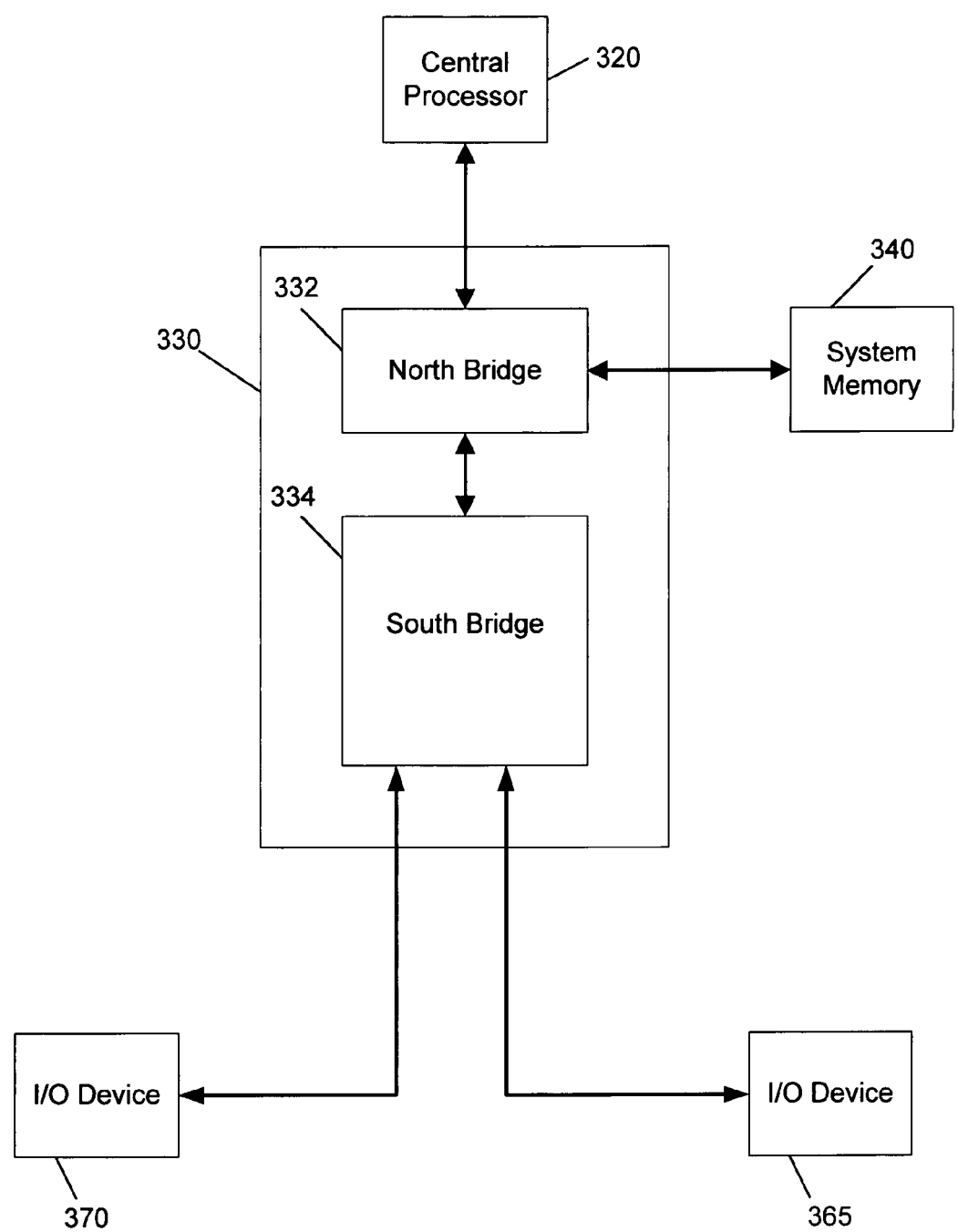
FIG. 4 is a block diagram of a system in accordance with one embodiment of the present invention.

FIG. 4 is a block diagram of a computer system which may be used with embodiments of the present invention. The computer system 300 includes a central processor 320 that is coupled to a chipset 330, which in turn is coupled to a system memory 340. In one embodiment, a system memory controller is located within a north bridge 332 of chipset 330. In another embodiment, a system memory controller is located on the same chip as central processor 320. Information, instructions, and other data may be stored in system memory 340 for use by central processor 320 as well as many other potential devices. Chipset 330, as well as other components of system 300 may include on-die moat capacitance in accordance with an embodiment of the present invention.

Input/output (I/O) devices, such as I/O devices 365 and 370, are coupled to a south bridge 334 of chipset 330 through one or more I/O interconnects. In one embodiment, the interconnects may be Peripheral Component Interconnect (PCI) interconnects, and I/O device 370 is a network interface card. In one embodiment, I/O device 365 is a serial advanced technology attachment (SATA) device such as a hard disk, a compact disk (CD) drive, or a digital video disc (DVD) drive. In this embodiment, a SATA host controller may be located within south bridge 334 of the chipset 330 to allow I/O device 365 to communicate with the rest of the computer system.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    core logic formed on a die to perform operations on data;
    a plurality of input/output (IO) buffers formed on the die and surrounding the core logic; and
    a moat capacitance formed on the die and surrounding the plurality of IO buffers and extending from a periphery of the plurality of IO buffers outwardly to an edge of the die.

2. The apparatus of claim 1, wherein the moat capacitance comprises a die periphery portion formed of metal-insulator-metal layers.

3. The apparatus of claim 1, wherein each of the plurality of IO buffers includes a pre-driver, a driver and a receiver.

4. The apparatus of claim 1, wherein the moat capacitance is trimmed during a design process based on at least one noise simulation.

5. The apparatus of claim 4, wherein the moat capacitance is trimmed from the die edge to the periphery of IO buffers.

6. The apparatus of claim 5, wherein the moat capacitance is trimmed in a first direction and a second direction.

7. The apparatus of claim 4, wherein the moat capacitance has a first amount of capacitance to substantially meet a noise specification of the apparatus, wherein the first amount does not include capacitance to exceed the noise specification.

8. The apparatus of claim 1, wherein the moat capacitance is to suppress noise generated by operation of the plurality of IO buffers.

9. The apparatus of claim 8, wherein the moat capacitance is the only on-die capacitance to suppress the noise.

10. The apparatus of claim 1, wherein a periphery of the core logic is immediately adjacent to an interior portion of the plurality of IO buffers and the periphery of the plurality of IO buffers is immediately adjacent to an interior portion of the moat capacitance.

11. The apparatus of claim 1, wherein the apparatus comprises a chipset.

12. A method comprising:
    designing a semiconductor device including a core logic to perform operations on data, a plurality of input/output (IO) buffers surrounding the core logic, and a moat capacitance surrounding the plurality of IO buffers and extending from a periphery of the plurality of IO buffers to an edge of the semiconductor device, the moat capacitance of a first size;
    performing at least one simulation on the designed semiconductor device and analyzing information of the at least one simulation, the information including performance information, timing information, and noise information;
    trimming a size of the moat capacitance of the designed semiconductor device from the first size to a second size smaller than the first size if the information indicates that the moat capacitance of the first size provides in excess of a margin for the designed semiconductor device; and
    fabricating the semiconductor device using semiconductor manufacturing equipment by depositing and patterning a plurality of layers on a semiconductor die.

13. The method of claim 12, further comprising trimming the moat capacitance in at least one of a first direction and a second direction.

14. The method of claim 12, further comprising designing the semiconductor device to have a periphery of the core logic immediately adjacent to an interior portion of the plurality of IO buffers and the periphery of the plurality of IO buffers immediately adjacent to an interior portion of the moat capacitance.

15. A system comprising:
    a processor;
    a chipset coupled to the processor and including a north bridge and a south bridge, the chipset including core logic formed on a die to perform operations on data, a plurality of input/output (IO) buffers formed on the die and surrounding the core logic, and a moat capacitance formed on the die and surrounding the plurality of IO buffers and extending outwardly from a periphery of the plurality of IO buffers to a first edge of the die, a second edge of the die, a third edge of the die, and a fourth edge of the die, wherein a periphery of the core logic is immediately adjacent to an interior portion of the plurality of IO buffers and the periphery of the plurality of IO buffers is immediately adjacent to an interior portion of the moat capacitance; and a system memory coupled to the chipset.

16. The system of claim 15, wherein the core logic includes a plurality of buffers each including pointer logic, slave delay lines, and a delay lock loop (DLL) analog core.

17. The system of claim 15, wherein the moat capacitance extends from the periphery of the IO buffers to at least one of the first, second, third and fourth edges with a fabricated size trimmed from an original design size, based on at least one noise simulation performed prior to fabrication of the chipset.

* * * * *